United States Patent [19]
Dietz

[11] 4,034,262
[45] July 5, 1977

[54] GATE DRIVE CIRCUIT FOR SCR DEFLECTION SYSTEM

[75] Inventor: Wolfgang Friedrich Wilhelm Dietz, New Hope, Pa.

[73] Assignee: RCA Corporation, New York, N.Y.

[22] Filed: Dec. 8, 1975

[21] Appl. No.: 638,848

[52] U.S. Cl. .................................. 315/408; 315/410
[51] Int. Cl.² .................... H01J 29/70; H01J 29/76
[58] Field of Search ......................... 315/408, 410

[56] References Cited
UNITED STATES PATENTS

| | | | |
|---|---|---|---|
| 3,936,115 | 2/1976 | Dietz | 315/408 |
| B 516,564 | 2/1976 | Hollander | 315/408 |

Primary Examiner—Maynard R. Wilbur
Assistant Examiner—T. M. Blum
Attorney, Agent, or Firm—Eugene M. Whitacre; Paul J. Rasmussen

[57] ABSTRACT

First pulses timed for enabling conduction of a first switch in a two-switch deflection system are delayed and combined with retrace pulses obtained from the system for forming second pulses suitably timed for enabling conduction of the second switch.

4 Claims, 7 Drawing Figures

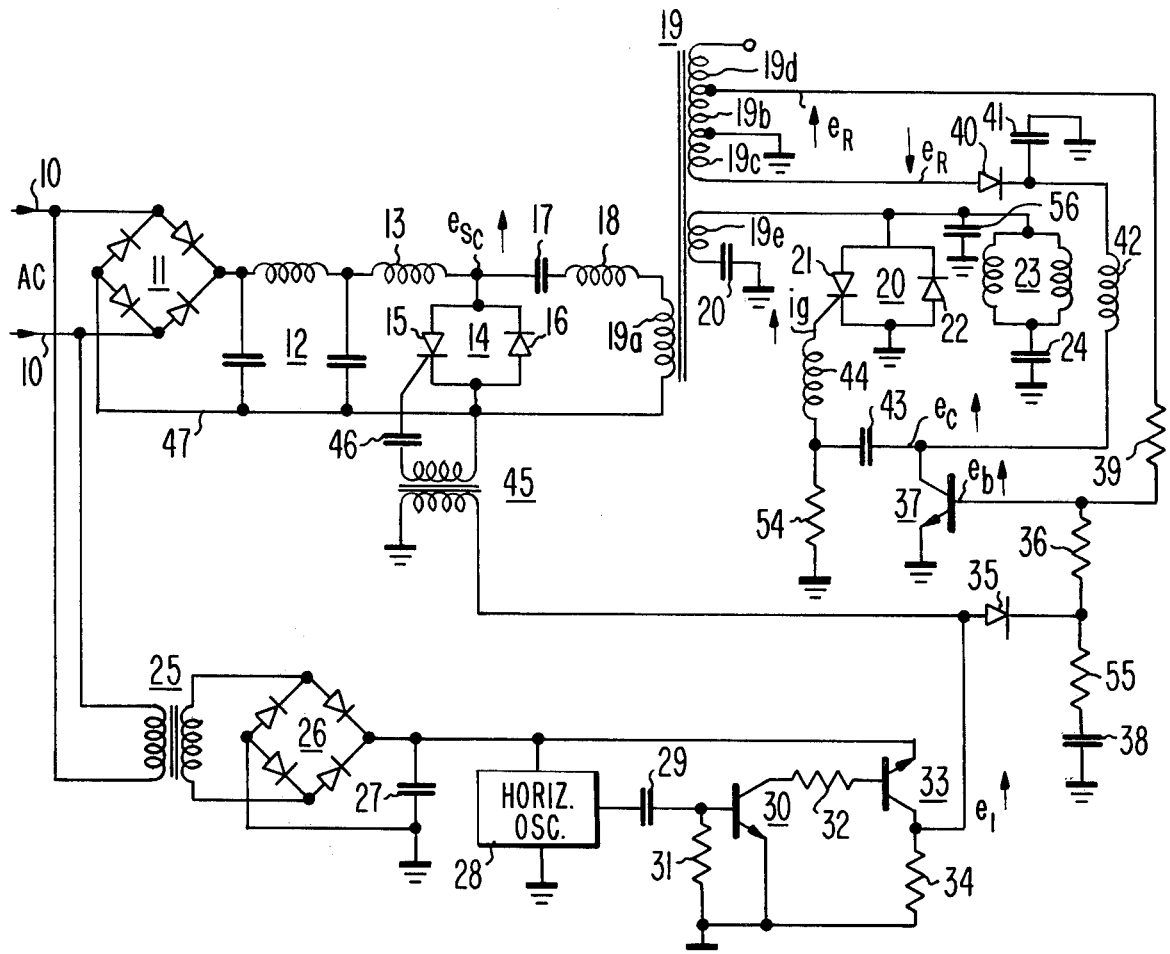
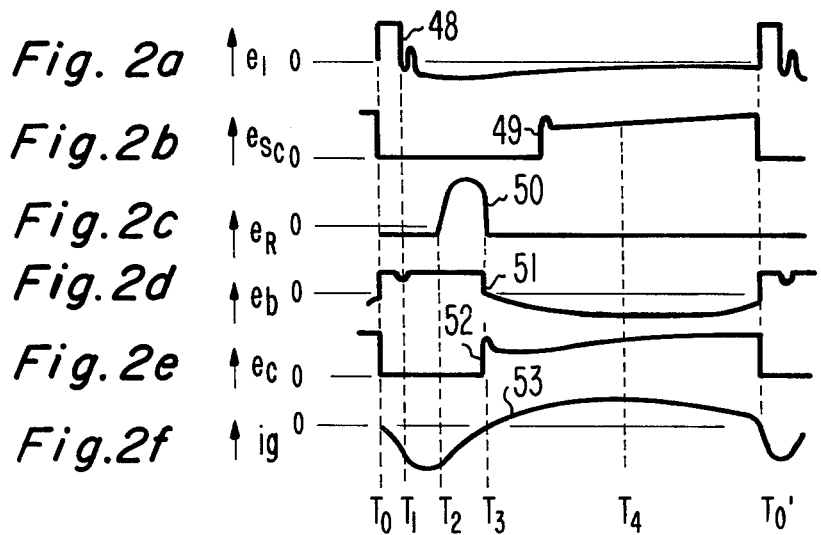
Fig.1
Fig. 2a
Fig. 2b
Fig. 2c
Fig. 2d
Fig. 2e
Fig. 2f 4,034,262

GATE DRIVE CIRCUIT FOR SCR DEFLECTION SYSTEM

BACKGROUND OF THE INVENTION

This invention relates to gate drive circuits for thyristor deflection systems such as used in television receivers.

A two bidirectional conducting switch deflection system is described in U.S. Pat. No. 3,452,244. Such a deflection system includes two switches each comprised of a diode coupled in parallel with a thyristor (SCR) and poled for forward conduction in opposite directions. A first switch is a commutating switch operative each deflection cycle to store energy in an inductor which energy is then transferred to other reactive components in the deflection circuit to replenish losses incurred by the supplying of scanning current to a deflection winding from a second switch during the trace portion of each deflection cycle.

The commutating and trace thyristors must be enabled for conduction during different portions of each deflection cycle. It has been common practice to gate the commutating thyristor with a pulse obtained from a horizontal rate oscillator. The trace switch thyristor commonly is gated by waveshaping a voltage obtained from the commutating circuit. Although an oscillator may be designed to provide the differently timed commutating and trace switch drive waveforms during each deflection cycle, this arrangement may not be the most efficient from the point of view that the oscillator would have to be specially designed for this purpose and would then not be compatible for use in alternative horizontal deflection systems employing a single output transistor.

Arrangements have been devised for utilizing the horizontal deflection circuit to provide chassis isolation from the input power line. This arrangement is desirable from the point of view of safety and for providing isolation from the line so that portions of the television receiver such as the video portions may be attached to remote video sources without the possibility of electrical shock to the user.

Since a thyristor deflection system of the type described in the aforementioned patent is suitable for supplying alternating current which may be rectified to provide direct current operating potential for the rest of the receiver, isolation of the deflection output stage is extremely desirable not only from the point of view of safety but also because of the cost saving achieved by eliminating the use of a separate isolation transformer on the incoming power line.

One point in the thyristor deflecion system at which isolation may be obtained is the coupling between the commutating and trace switches by means of a transformer which may be a part of the horizontal output transformer for cost saving reasons. In such a situation a problem arises in driving the trace switch from the commutating circuit because the trace switch is isolated whereas the commutating switch is not. It is desirable to keep the number of connections such as transformer connections between the isolated and non-isolated portions of the deflection system to a minimum. Hence, an alternative way to the transformer coupling arrangement or the second oscillator output arrangement for driving the trace thyristor is desirable.

SUMMARY OF THE INVENTION

A gate drive circuit for a thyristor deflection system includes a source of first pulses coupled to enable a first switch for conduction and a second switch requiring second enabling pulses offset in time from said first pulses. A source of retrace pulses within the deflection system and pulses from the first source are coupled to means for delaying the first pulses for forming second pulses which are then coupled to the second switch for enabling conduction thereof.

A more detailed description of the invention is given in the following pages and accompanying drawing of which:

FIG. 1 is a block and schematic circuit diagram of a thyristor deflection system embodying a gate drive circuit according to the invention and FIGS. 2a–2f illustrate voltage and current waveforms obtained at various places in the circuit of FIG. 1.

DESCRIPTION OF THE INVENTION

In FIG. 1 the alternating current power line is coupled through terminals 10 to a bridge rectifier 11 and the pulsating dc obtained therefrom is smoothed by a filter network 12. Direct current from network 12 is coupled through an input reactor 13 to the top of a commutating switch 14 comprising a commutating thyristor 15 and a parallelly coupled diode 16 poled for conducting forward current in opposite directions. The top of commutating switch 14 is coupled to a series coupled commutating capacitor 17, a commutating inductor 18 and a primary winding 19a of a horizontal output transformer 19. It is noted that the circuit described thus far is not isolated from the incoming alternating current line but is floating at the potential thereof and no referenced to chassis ground.

Isolation in the deflection system is provided at the secondary windings of transformer 19. A secondary winding 19e is AC coupled to chassis ground by a capacitor 20 and has its other terminal coupled to a trace switch 20 comprising parallelly coupled, oppositely poled thyristor 21 and diode 22. Series-coupled horizontal deflection windings 23 and S-shaping capacitor 24 are coupled in parallel with trace switch 20.

The alternating current input line is also coupled to a primary winding of a relatively small and inexpensive stepdown transformer 25, the secondary of which is coupled to a bridge rectifier 26. The direct current obtained from rectifier 26 is smoothed by filter capacitor 27 which is referenced to chassis ground. The direct current obtained from capacitor 27 provides operating voltage for horizontal oscillator 28 and transistors 30 and 33 which are referenced to ground. Horizontal rate pulses obtained from horizontal oscillator 28 are coupled through capacitor 29 to the base of transistor 30. The inverted pulses are coupled from the collector of transistor 30 through resistor 32 to the base of transistor 33. The junction of load resistor 34 and the collector of transistor 33 provide again inverted pulses which are illustrated by voltage waveform 48 of FIG. 2a. These pulses are coupled to the anode of blocking diode 35 and to a primary winding of an isolation transformer 45. The secondary of transformer 45 is AC coupled by a capacitor 46 to provide positive going gate drive pulses to thyristor 15.

Winding 19c of transformer 19 provides pulses such as illustrated by voltage waveform 50 of FIG. 2c, the trace portions of which are rectified by diode 40 and smoothed by capacitor 41 and inductor 42 to provide direct current to the collector of a transistor 37 which has its emitter grounded. Inductor 2 is also an energy storage element which supplies gate drive current to SCR 21 when transistor 37 is not conducting. There are two base signals coupled to the base of inverting transistor 37. The first is the oscillator pulse 48 coupled through resistor 36 to the base of transistor 37. Series coupled resistor 55 and capacitor 38 provide a delay to the trailing edge of oscillator pulse 48. The second is a retrace pulse 50 coupled from secondary winding 19b of horizontal output transformer 19 through a resistor 39 to the base of transistor 37. Resistor 36 provides isolation such that the retrace pulses 50 are not delayed by capacitor 38. The combined oscillator and retrace pulse components form a voltage waveform 51 such as illustrated in FIG. 2d at the base of transistor 37. By virtue of the delaying action of the RC network just described the base waveform of transistor 37 is continuous from the start of oscillator pulse 48 at $T_0$ to the end of the retrace pulse 50 at $T_3$, even though taken individually there is a break in time between the end of pulse 48, at $T_1$, and the start of retrace pulse 50 at $T_2$. The negative going portion of retrace pulse 50 determines the end of conduction of transistor 37 during each deflection cycle.

The voltage waveform 51 at the base of transistor 37 is inverted and appears at its collector as a voltage waveform 52 of FIG. 2e. This waveform is shaped by capacitor 43, resistor 54 and inductor 44 for providing a suitably shaped gate current $I_g$ as illustrated by waveform 53 of FIG. 2f to the trace thyristor 21. It is noted that the inverted voltage waveform 52 provides for the cutoff of thyristor 21 during the period $T_0 - T_3$ enables the thyristor for conduction during the period $T_3 - T_0'$, the greatest drive current being provided by waveshaping network at $T_4$ so that SCR 21 may conduct deflection current during the second half of the trace period.

The operation of the thyristor deflection system is similar to that described in the aforementioned U.S. Pat. No. 3,452,244 with energy stored in input reactor 13 during the first half portion of waveform 49 of FIG. 2b when commutating SCR 15 is conducting. This energy is transferred through commutating capacitor 17 and commutating inductor 18 and primary winding 19a when thyristor 15 is no longer conducting to replenish the energy in capacitors 20 and 24 which is dissipated during each deflection cycle.

In the isolated deflection system embodiment of FIG. 1 the trace thyristor gate drive circuit described eliminates a connection point to the commutating portion of the circuit and eliminates the need for a separate oscillator as described above. The values of resistor 55 and capacitor 38 are selected to provide the desired delay of oscillator pulses 48 such that when combined with retrace pulses 50 provide a suitable trace gate drive waveform for thyristor 21.

What is claimed is:

1. A gate drive circuit for a thyristor deflection system in which a second thyristor switch couples a deflection winding to an energy storage source during a trace interval and a first thyristor switch couples energy to said source during a commutating interval, comprising:
   a source of first pulses timed for enabling said first switch for conduction;
   said second switch requiring second enabling pulses offset in time from said first pulses;
   a source of retrace pulses in said deflection system;
   means coupled to said sources of first and retrace pulses for delaying said first pulses and for combining said delayed first pulses with said retrace pulses for forming said second pulses; and
   means coupling said second pulses to said second switch for enabling conduction thereof.

2. A gate drive circuit according to claim 1 wherein said combined first and retrace pulses are of the same polarity.

3. A gate drive circuit according to claim 2 wherein said means coupling said second pulses to said second switch includes means for inverting the polarity of said combined pulses such that said second switch is enabled at the end of said combined pulse duration.

4. A gate drive circuit for thyristor deflection system including first and second thyristor switches for respectively coupling energy to an energy storage means during a commutating interval and for coupling a deflection winding to said energy storage means during a trace interval said switches requiring conduction enabling gate drive pulses occurring at different times, comprising:
   a source of first pulses coupled to said first thyristor for enabling conduction thereof, said first pulse occurring without the desired period of conduction enablement of said second switch;
   a source of retrace pulses within said deflection system occurring totally without the duration of said first pulses;
   delay and combining means coupled to said sources of first and retrace pulses for delaying said first pulses and combining said delayed first pulses with said retrace pulses for forming second pulses having a duration equal to the delayed duration of said first pulses and said retrace pulses; and
   means for inverting said second pulses and for coupling said inverted second pulses to said second switch for preventing conduction of said second switch for the duration of said inverted second pulses and for enabling conduction of said second switch for the period between successive ones of said inverted second pulses.

* * * * *